United States Patent
Washio et al.

(10) Patent No.: US 7,335,465 B2
(45) Date of Patent: Feb. 26, 2008

(54) DEVELOPER COMPOSITION FOR RESISTS AND METHOD FOR FORMATION OF RESIST PATTERN

(75) Inventors: Yasushi Washio, Kawasaki (JP); Koji Saito, Kawasaki (JP)

(73) Assignee: Tokyo Ohka Kogyo Co., Ltd., Kawasaki-shi (JP)

( * ) Notice: Subject to any disclaimer, the term of this patent is extended or adjusted under 35 U.S.C. 154(b) by 0 days.

(21) Appl. No.: 10/560,155

(22) PCT Filed: Jun. 10, 2004

(86) PCT No.: PCT/JP2004/008508

§ 371 (c)(1),
(2), (4) Date: Dec. 9, 2005

(87) PCT Pub. No.: WO2004/111730

PCT Pub. Date: Dec. 23, 2004

(65) Prior Publication Data

US 2006/0127825 A1     Jun. 15, 2006

(30) Foreign Application Priority Data

Jun. 13, 2003 (JP) ............................. 2003-169834

(51) Int. Cl.
G03F 7/30 (2006.01)
G03G 7/32 (2006.01)
(52) U.S. Cl. .................... 430/331; 430/309
(58) Field of Classification Search ................ 430/331, 430/309
See application file for complete search history.

(56) References Cited

U.S. PATENT DOCUMENTS

| | | | |
|---|---|---|---|
| 3,207,725 A | 9/1965 | Pfeifer | |
| 5,300,404 A | 4/1994 | Tani et al. | |
| 5,543,268 A | 8/1996 | Tanaka et al. | |
| 5,985,525 A | 11/1999 | Sato et al. | |
| 6,329,126 B1 * | 12/2001 | Tanaka et al. | 430/331 |
| 6,451,510 B1 | 9/2002 | Messick et al. | |
| 6,511,790 B2 * | 1/2003 | Takamiya | 430/302 |
| 7,063,937 B2 | 6/2006 | Takamiya | |
| 7,147,995 B2 | 12/2006 | Takamiya | |

| | | | |
|---|---|---|---|
| 2003/0091732 A1 * | 5/2003 | Kanda | 427/162 |
| 2004/0185371 A1 | 9/2004 | Takamiya | |

FOREIGN PATENT DOCUMENTS

| | | |
|---|---|---|
| EP | 0272686 | 6/1988 |
| EP | 0323836 | 7/1989 |
| JP | 61232453 | 10/1986 |
| JP | 64072154 | 3/1989 |
| JP | 4-204454 | 7/1992 |
| JP | 10010749 | 1/1998 |
| JP | 2000155428 | 6/2000 |

OTHER PUBLICATIONS

Office Action drafted Jul. 27, 2007 in connection with Japanese Patent Application No. 2003-169834.
Office Action drafted Jul. 31, 2007 in connection with Japanese Patent Application No. 2003-184708.

* cited by examiner

*Primary Examiner*—Hoa Van Le
(74) *Attorney, Agent, or Firm*—Knobbe, Martens, Olson & Bear LLP

(57) ABSTRACT

To provide a developer composition for resists, capable of improving dimensional controllability of a resist pattern. The developer composition for resists comprises an organic quaternary ammonium base as a main component, said developer composition further comprising an anionic surfactant represented by the following general formula (I), and $SO_4^{2-}$, the content of $S_4^{2-}$ being from 0.01 to 1% by mass.

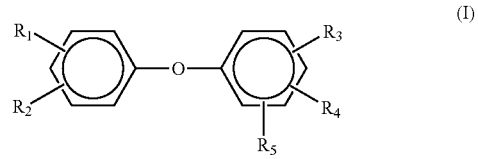

(I)

In the formula, at least one of $R_1$ and $R_2$ represents an alkyl or alkoxy group having 5 to 18 carbon atoms and the other one represents a hydrogen atom, or an alkyl or alkoxy group having 5 to 18 carbon atoms, and at least one of $R_3$, $R_4$ and $R_5$ represents an ammonium sulfonate group or a sulfonic acid-substituted ammonium group and the others represent a hydrogen atom, an ammonium sulfonate group or a sulfonic acid-substituted ammonium group.

11 Claims, No Drawings

DEVELOPER COMPOSITION FOR RESISTS AND METHOD FOR FORMATION OF RESIST PATTERN

This application is the U.S. National Phase under 35 U.S.C. §371 of International Application PCT/JP04/008508, filed Jun. 10, 2004, which claims priority to Japanese Patent Application No. 2003-169834, filed Jun. 13, 2003. The International Application was published under PCT Article 21(2) in a language other than English.

TECHNICAL FIELD

The present invention relates to a developer composition for resists, and a method for formation of a resist pattern.

BACKGROUND ART

Resist patterns have hitherto been formed by applying a resist composition on a substrate to form a resist layer, prebaking the resist layer, selectively exposing the prebaked resist layer to light, optionally subjecting it to PEB (post exposure baking), and alkali-developing the exposed resist layer with a developer composition for resists.

As the developer composition for resists, for example, there is known a developer composition obtained by adding an anionic surfactant having a specific ammonium sulfonate group or sulfonic acid-substituted ammonium group to an aqueous solution containing an organic quaternary ammonium salt such as trimethylammonium hydroxide as a main component, as described in Patent Document 1.

[Patent Document 1] Japanese Patent No. 2589408

However, when the development is conducted by using a conventional developer composition for resists, the resulting resist pattern may have poor dimensional controllability (reproducibility to a mask pattern).

DISCLOSURE OF THE INVENTION

Under these circumstances, the present invention has been made and an object thereof is to provide a developer composition for resists, which is excellent in dimensional controllability of a resist pattern, and a method for formation of a resist pattern using the same.

To achieve the above object, the present invention provides the following aspects.

A first aspect of the present invention is directed to a developer composition for resists, comprising an organic quaternary ammonium base as a main component, said developer composition further comprising an anionic surfactant represented by the following general formula (I):

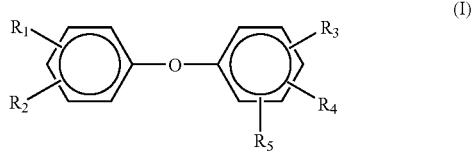

wherein at least one of $R_1$ and $R_2$ represents an alkyl or alkoxy group having 5 to 18 carbon atoms and the other one represents a hydrogen atom, or an alkyl or alkoxy group having 5 to 18 carbon atoms, and at least one of $R_3$, $R_4$ and $R_5$ represents an ammonium sulfonate group or a sulfonic acid-substituted ammonium group and the others represent a hydrogen atom, an ammonium sulfonate group or a sulfonic acid-substituted ammonium group, and $SO_4^{2-}$, the content being from 10 to 10,000 ppm.

A second aspect of the present invention is directed to a method for formation of a resist patter, which comprises applying a resist composition on a substrate, followed by prebaking, selective exposure to light and an alkali development with the developer composition for resists of the present invention to form a resist pattern.

In the present specification, an alkyl group, or an alkyl group constituting an alkoxy group may be a straight-chain or branched group.

BEST MODE FOR CARRYING OUT THE INVENTION

[Developer Composition for Resists]

The developer composition for resists of the present invention is a developer composition for resists comprising an organic quaternary ammonium base as a main component (alkali developer), said developer composition further comprising an anionic surfactant represented by the following general formula (I) and including any of the following first to third embodiments.

First, the composition of a base will be described.

Organic Quaternary Ammonium Base

The organic quaternary ammonium base is not specifically limited as long as it is used in a developer composition resists and, for example, it is a quaternary ammonium base having a lower alkyl group or a lower hydroxyalkyl group. The lower alkyl group or lower hydroxyalkyl group has 1 to 5 carbon atoms, preferably 1 to 3 carbon atoms, and more preferably 1 or 2 carbon atoms.

Among these organic quaternary ammonium bases, tetetramethylammonium hydroxide and trimethyl(2-hydroxyethyl)ammonium hydroxide, i.e., choline, and tetrapropylammonium hydroxide are particularly preferable. These organic quaternary ammonium bases may be used alone or in combination.

The amount of the organic quaternary ammonium base is not specifically limited and is usually from 0.1 to 10% by mass, and preferably from 2 to 5% by mass, based on the developer composition for resists.

The solvent in the developer composition for resists is usually water.

Other Components

In addition to the above-described essential components, the developer for resists may be optionally mixed with additive components conventionally used in a developer for resists of the prior art, for example, wetting agents, stabilizers, solubility aids, and cationic surface active agents for improving the selectivity in the solubility behavior between the exposed and nonexposed areas of a resist layer. These additive components may be added alone or in combination.

Anionic Surfactant

At least one of $R_3$, $R_4$ and $R_5$ in the general formula (I) is an ammonium sulfonate group or a sulfonic acid-substituted ammonium group.

The sulfonic acid-substituted ammonium group may be any of mono-substituted, di-substituted, tri-substituted and tetra-substituted ammonium groups, and examples of the substituent include —$CH_3$, —$C_2H_5$, —$CH_2OH$, and —$C_2H_4OH$.

In the case of the multi-substituted ammonium group, the substituent may be the same or different.

specific examples of the anionic surfactant represented by the general formula (I) include ammonium alkyl diphenyl ether sulfonate, tetramethyl ammonium alkyl diphenyl ether sulfonate, trimethyl ethanol ammonium alkyl diphenyl ether sulfonate, triethyl ammonium alkyl diphenyl ether sulfonate, ammonium alkyl diphenyl ether disulfonate, diethanol ammonium alkyl diphenyl ether disulfonate, and tetramethyl ammonium alkyl diphenyl ether disulfonate.

$R_1$ and $R_2$ may be an alkyl group having 5 to 18 carbon atoms or an alkoxy group having 5 to 18 carbon atoms.

As a matter of course, these anionic surfactants used in the present invention are not specifically limited and may be used alone or in combination.

The amount of these anionic surfactants is selected within a range from 500 to 100,000 ppm, and preferably from 1,000 to 50,000 ppm based on the developer composition for resists containing an organic quaternary ammonium base as a main component. By adjusting the amount to 500 ppm or more, it is made possible to improve the wetting behavior and the resolution. By adjusting the amount to 100,000 ppm or less, it is made possible to prevent the selectivity in the solubility behavior between the areas irradiated and unirradiated with actinic rays from deteriorating, and thus a resist with good profile can be obtained after the development and the heat resistance of the resist can be improved.

(1) First Embodiment

According to the first embodiment, the content of $SO_4^{2-}$ in the developer composition for resists is controlled within a range from 10 to 10,000 ppm, preferably from 50 to 5,000 ppm, and most preferably from 100 to 1,000 ppm.

By adjusting the content within the above range, the dimensional controllability of the resist pattern can be improved. By adjusting the content to the lower limit or more, it is made-possible to prevent the pattern size from widening. By adjusting the content to the upper limit or less, it is made possible to prevent the pattern size from narrowing.

The content of $SO_4^{2-}$ can be measured by ion chromatography. The content of $SO_4^{2-}$ can be adjusted by adding sulfates such as sodium sulfate.

(2) Second Embodiment

According to the second embodiment, the developer composition for resists contains a lower alcohol in the first embodiment in the amount within a range from 0.01 to 5% by mass, preferably from 0.05 to 2.5% by mass, and most preferably from 0.1 to 1% by mass.

The lower alcohol has 1 to 5 carbon atoms and is preferably ethanol or methanol, and is more preferably methanol.

By adjusting the content of the alcohol within the above range, the dimensional controllability of the resist pattern can be improved. By adjusting the content of alcohol to the lower limit or more, it is made possible to prevent the pattern size from narrowing. By adjusting the content of the alcohol to the upper limit or less, it is made possible to prevent the pattern size from widening.

The content of the lower alcohol can be measured by gas chromatography. The content of the lower alcohol can be adjusted by adding a lower alcohol.

(3) Third Embodiment

According to the third embodiment, a halogen ion is contained and the content is from 1,000 ppm or less, preferably 500 ppm or less, and most preferably 300 ppm or less, in the first or second embodiment. In the third embodiment, the halogen ion is not indispensable, and the lower the content, the better.

Examples of the halogen ion include chloride ion ($Cl^-$), bromide ion ($Br^-$) and fluoride ion ($F^-$), and it is preferable to adjust the chloride ion.

By adjusting the content of the halogen ion, the dimensional controllability of the resist pattern is improved. Particularly, there is exerted a strong effect of improving the dimensional controllability of a resist pattern formed by using a polyimide-based resist composition containing a polyimide resin as a base resin.

The content of the halogen ion can be measured by ion chromatography.

The content of the halogen ion can be adjusted by removing using the ion exchange method.

The third embodiment includes the first or second embodiment, and includes both the first and second embodiments most preferably.

[Method for Formation of Resist Pattern]

The resist, to which the developer composition of the present invention is applied, is not specifically limited as long as it can be developed with an alkali developer, and any of positive-working and negative-working resists can be applied.

The method for formation of a resist pattern of the present invention can be conducted in the following manner.

First, the positive-working resist composition is applied on a substrate such as silicon wafer using a spinner or a coater, and then the resulting resin resist layer is prebaked at a temperature of 80 to 150° C. for 40 to 1200 seconds, and preferably 120 to 600 seconds. The prebaked layer us selectively exposed to light through a desired mask patter, thereafter, the exposed resist layer is subjected to PEB (post exposure baking) at a temperature of 80 to 150° C. for 40 to 600 seconds, and preferably 60 to 300 seconds.

The temperature condition and presence or absence of the PEB step can be appropriately changed according to characteristics of the resist composition. In the case of a chemical amplification type resist composition, the PEB step is usually necessary.

Then, the exposed resist layer is developed using the developer composition for resists of the present invention In such a manner, a resist pattern faithful to a mask pattern can be obtained.

A dry film type is preferably used as the resist composition.

An organic or inorganic anti-reflection film can also be provided between a substrate and a coating layer made of a resist composition.

As described above, the developer composition for resists of the present invention and the method for formation of a resist pattern are excellent in dimensional controllability of the resist pattern. For example, there can be obtained a resist pattern having a dimensional tolerance within ±10%, and preferably within ±5%, based on a target of a mask pattern.

In the developer composition for resists of the present invention and the method for formation of a resist pattern, a specific anionic surfactant is used. The specific anionic surfactant exerts the following excellent effects. That is, the resulting developer has good penetrability as well as good detergency and dissolving power so that the resist layer formed on the substrate is completely free from occurrence of deposition of scum or thin film residue in the fine patterns, and thus the heat resistance of the resulting resist pattern does not deteriorate.

According to the present invention, it is made possible to exert the effect of achieving excellent dimensional controllability of the resist pattern while maintaining excellent effect of the anionic surfactant.

EXAMPLES

The present invention will be described in more detail by way of examples.

(Preparation of Developer Composition for Resists)

To a first aqueous solution of 2.38% by mass of tetramethylammonium hydroxide, each of anionic surfactants shown in Tables 1 to 3 was added to prepare a second aqueous solution.

To the second aqueous solution, sodium sulfate, methanol or hydrochloric acid was added so that the contents of sulfate ion, methanol and chloride ion are as shown in Tables 1 to 3 to prepare developer compositions for resists with the compositions shown in Tables 1 to 3.

Evaluation: Examples 1 to 18, 23 and 24 as Well as Comparative Examples 1 to 3

The developer compositions for resists of Examples 1 to 18, 23 and 24 as well as Comparative Examples 1 to 3 were evaluated in the following manner. Using a spinner, a positive-working photoresist containing a novolak resin and a naphthoquinone diazide compound as a constituent component PMERP-LA900PM (trade name, manufactured by Tokyo Ohka Kogyo Co., Ltd.) was applied on a gold-sputtered wafer 5 inches in diameter at a thickness of 20 μm dried, followed by a pre-baking treatment on a hot plate at 110° C. for 360 seconds to form a photoresist layer.

The photoresist layer thus formed was exposed patternwise to light on an exposure machine (PLA-501F, manufactured by Canon Sales Co., Inc.) through a test chart reticle (mask pattern) and then subjected to a development treatment using a static-paddle development apparatus.

The development treatment was undertaken with the developer composition for resists prepared above at a temperature of 23° C. for 480 seconds by the static-paddle development method, followed by rinse of the wafer for 30 seconds with pure water and drying.

The target of the test chart reticle had a pattern with a rectangular cross section of 5 to 40 μm in width.

The pattern size of the bottom portion of the resulting resist pattern was measured by cross section SEM (manufactured by Hitachi, Ltd., under the trade name "S4000"). The results are summarized in Tables 1 to 3.

Evaluation: Examples 19 to 22 and Comparative Example 4

The developer compositions for resists of Examples 19 to 22 and Comparative Example 4 were evaluated in the following manner. Using a spinner, a positive-working polyimide-based photoresist SUMIRESIN EXCEL CRC-8000 (trade name, manufactured by SUMITOMO BAKELITE Co., Ltd.) was applied on a gold-sputtered wafer of 5 inches in diameter at a thickness of 5 μm dried, followed by a pre-baking treatment on a hot plate at 110° C. for 120 seconds to form a photoresist layer.

The photoresist layer thus formed was exposed patternwise to light on an exposure machine (PLA-501F, manufactured by Canon Sales Co., Inc.) through a test chart reticle (mask pattern) and then subjected to a development treatment using a static-paddle development apparatus.

The development treatment was undertaken with the developer composition for resists prepared as described above at a temperature of 23° C. for 120 seconds by the static-paddle development method, followed by rinsing of the wafer for 30 seconds with pure water and drying.

The target of the test chart reticle had a pattern with a rectangular cross section of 5 to 40 μm in width.

The pattern size of the bottom portion of the resulting resist pattern was measured by cross section SEM (manufactured by Hitachi, Ltd., under the trade name "S4000"). The results are summarized in Tables 2 and 3.

Evaluation: Example 25

The developer composition for resists of Example 25 was evaluated in the following manner. Using a spinner, a positive-working photoresist containing a novolak resin and a naphthoquinone diazide compound as a constituent component TSMR-V3 (trade name, manufactured by Tokyo Ohka Kogyo Co., Ltd.) was applied on a silicon wafer 5 inches in diameter at a thickness of 1 μm dried, followed by a pre-baking treatment on a hot plate at 90° C. for 90 seconds to form a photoresist layer.

The photoresist layer thus formed was exposed patternwise to light on an exposure machine (PLA-501F, manufactured by Canon Sales Co., Inc.) through a test chart reticle (mask pattern), followed by a heating treatment on a hot plate at 110° C. for 60 seconds and a development treatment using a static-paddle development apparatus.

The development treatment was undertaken with the developer composition for resists prepared as described above at a temperature of 23° C. for 65 seconds by the static-paddle development method, followed by rinsing of the wafer for 30 seconds with pure water and drying.

The target of the test chart reticle had a pattern with a rectangular cross section of 5 to 40 μm in width.

The pattern size of the bottom portion of the resulting resist pattern was measured by cross section SEM (manufactured by Hitachi, Ltd., under the trade name "S4000"). The results are summarized in Table 2.

The dimensional controllability as an item for evaluation in the tables is evaluated according to the following criteria.

A (Excellent): The formed resist pattern has a dimensional tolerance within ±5% based on a target of a mask pattern.

B (Good): The formed resist pattern has a dimensional tolerance within ±10% based on a target of a mask pattern C (Poor): The formed resist pattern has a dimensional tolerance over ±10% based on a target of a mask pattern.

TABLE 1
| | Anionic surfactant | | Amount (ppm) | Sulfate ion (ppm) | Methanol (% by mass) | Chloride ion (ppm) | Dimensional controllability |
|---|---|---|---|---|---|---|---|
| | Kind | | | | | | |
| Example 1 | 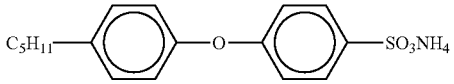 | | 1000 | 700 | 0.3 | 300 | B |
| Example 2 | 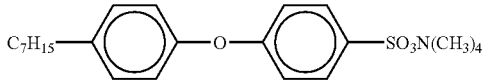 | | 2000 | 700 | 0.3 | 300 | B |
| Example 3 | 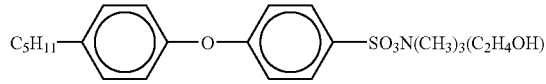 | | 3000 | 700 | 0.3 | 300 | B |
| Example 4 | 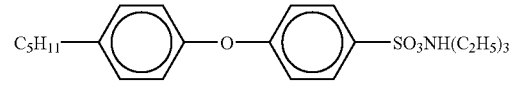 | | 5000 | 700 | 0.3 | 300 | B |
| Example 5 | 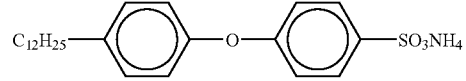 | | 2000 | 700 | 0.3 | 300 | B |
| Example 6 | 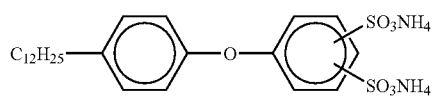 | | 3000 | 700 | 0.3 | 300 | B |
| Example 7 | 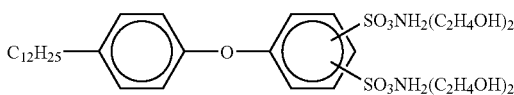 | | 5000 | 700 | 0.3 | 300 | B |
| Example 8 | 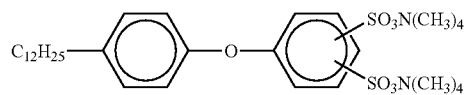 | | 4000 | 700 | 0.3 | 300 | B |
| Example 9 | 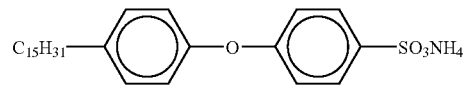 | | 10000 | 700 | 0.3 | 300 | B |
| Example 10 | 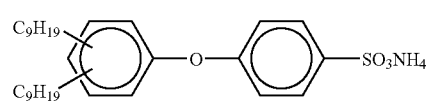 | | 8000 | 700 | 0.3 | 300 | B |
| Example 11 | 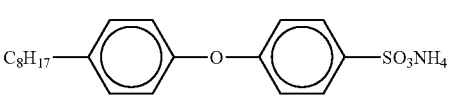 | | 2500 2500 | 700 | 0.3 | 300 | B |
| Example 12 | 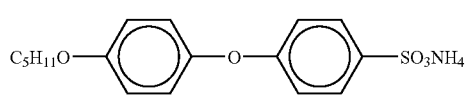 | | 5000 | 700 | 0.3 | 300 | B |

TABLE 2
| | Anionic surfactant | | Amount (ppm) | Sulfate ion (ppm) | Methanol (% by mass) | Chloride ion (ppm) | Dimensional controllability |
|---|---|---|---|---|---|---|---|
| | Kind | | | | | | |
| Example 13 | 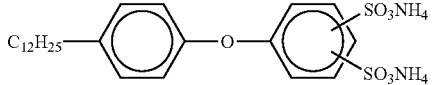 | | 3000 | 500 | 0.005 | 2000 | B |
| Example 14 | 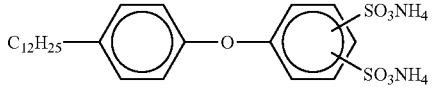 | | 3000 | 700 | 0.005 | 2000 | B |
| Example 15 | 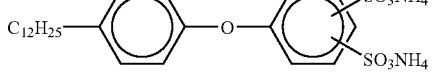 | | 3000 | 5000 | 0.005 | 2000 | B |
| Example 16 | 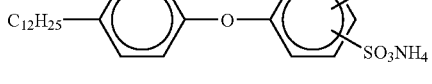 | | 3000 | 700 | 0.05 | 2000 | B |
| Example 17 | 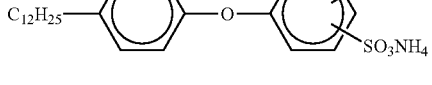 | | 3000 | 700 | 0.3 | 2000 | B |
| Example 18 | 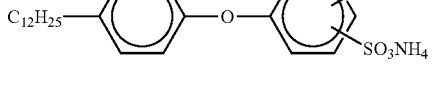 | | 3000 | 700 | 2.5 | 2000 | B |
| Example 19 | 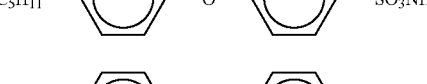 | | 1000 | 700 | 0.3 | 300 | A |
| Example 20 |  | | 1000 | 700 | 0.3 | 500 | B |
| Example 21 | 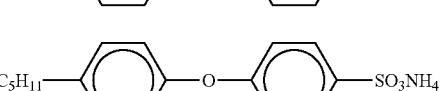 | | 1000 | 700 | 0.005 | 300 | B |
| Example 22 | 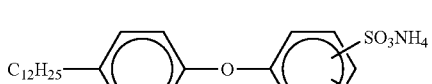 | | 1000 | 700 | 0.005 | 500 | B |
| Example 23 | 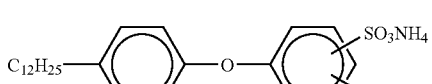 | | 20000 | 700 | 0.3 | 300 | A |
| Example 24 | 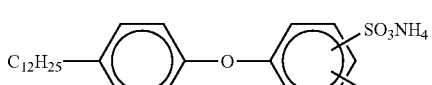 | | 50000 | 700 | 0.3 | 300 | B |
| Example 25 |  | | 3000 | 700 | 0.3 | 300 | B |

TABLE 3

| | | Anionic surfactant | | | | |
|---|---|---|---|---|---|---|
| | Kind | Amount (ppm) | Sulfate ion (ppm) | Methanol (% by mass) | Chloride ion (ppm) | Dimensional controllability |
| Comparative Example 1 | — | — | 700 | 0.3 | 300 | C |
| Comparative Example 2 | $C_9H_{19}$—⟨⟩—O—⟨⟩—O(CH$_2$CH$_2$)$_{10}$H | 5000 | 700 | 0.3 | 300 | C |
| Comparative Example 3 | $C_{12}H_{25}$—⟨⟩—O—⟨⟩(SO$_3$NH$_4$)(SO$_3$NH$_4$) 1) | 3000 | 20000 | 0.005 | 2000 | C |
| Comparative Example 4 | $C_5H_{11}$—⟨⟩—O—⟨⟩—SO$_3$NH$_4$ | 1000 | 2000 | 0.005 | 2000 | C |

1) Norifonic surfactant described in Japanese Patent Application, First Publication No. Sho 63-25650

As is apparent from the results shown in Tables 1 and 2, the resulting resist patterns were excellent in dimensional controllability in the Examples of the present invention.

EFFECTS OF THE INVENTION

As described above, the present invention can provide a developer composition for resists, which is excellent in dimensional controllability of a resist pattern, and a method for formation of a resist pattern using the same.

INDUSUTRIAL APPLICABILITY

The present invention provides a developer composition for resists, which is excellent in dimensional controllability of a resist pattern, and a method for formation of a resist pattern using the same, and is therefore extremely useful for industrially.

The invention claimed is:

1. A developer composition for resists, comprising an organic quaternary ammonium base as a main component, said organic quaternary ammonium base having a lower alkyl group or a lower hydroxyalkyl group, wherein the lower alkyl group or lower hydroxyalkyl group has 1 to 5 carbon atoms, wherein said organic quaternary ammonium base is present in an amount from 0.1 to 10% by mass;
   an anionic surfactant in an amount from 1,000 to 50,000 ppm represented by the following general formula (I):

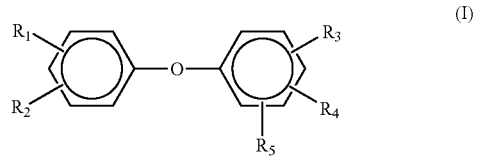

wherein at least one of $R_1$ and $R_2$ represents an alkyl or alkoxy group having 5 to 15 carbon atoms and the other one represents a hydrogen atom, or an alkyl or alkoxy group having 5 to 15 carbon atoms, and at least one of $R_3$, $R_4$ and $R_5$ represents an ammonium sulfonate group or a sulfonic acid-substituted ammonium group and the others represent a hydrogen atom, an ammonium sulfonate group or a sulfonic acid-substituted ammonium group;
   $SO_4^{2-}$ in an amount from 50 to 5,000 ppm; and
   a lower alcohol in an amount from 0.005 to 2.5% by mass.

2. A method for formation of a resist pattern, comprising applying a resist composition on a substrate to form a resist layer, prebaking the resist layer, selectively exposing the prebaked resist layer to light, and alkali-developing the exposed resist layer with the developer composition for resists according to claim 1 to form a resist pattern.

3. The developer composition for resists according to claim 1, wherein said lower alcohol has 1 to 5 carbon atoms.

4. The developer composition for resists according to claim 3, wherein the lower alcohol is ethanol or methanol.

5. The developer composition for resists according to claim 1, wherein the amount of said organic quaternary ammonium base is 0.1 to 10% by mass based on the developer composition for resists.

6. The developer composition for resists according to claim 1, further comprising a halogen ion in an amount of 300 to 2,000 ppm.

7. The developer composition for resists according to claim 6, wherein the amount of the halogen ion is from 300 to 1,000 ppm.

8. The developer composition for resists according to claim 1, wherein said organic quaternary ammonium base is in an amount from 2 to 5% by mass.

9. The developer composition for resists according to claim 1, wherein said $SO_4^{2-}$ is in an amount from 100 to 1,000 ppm.

10. The developer composition for resists according to claim 1, wherein said lower alcohol in is in an amount from 0.1 to 1% by mass.

11. The developer composition for resists according to claim 6, wherein said halogen ion is in an amount of 1,000 ppm or less.

* * * * *